(12) United States Patent
Dong et al.

(10) Patent No.: US 10,142,050 B2
(45) Date of Patent: Nov. 27, 2018

(54) ENCODING MODULATION METHOD AND TRANSMITTER

(71) Applicant: ZTE CORPORATION, Shenzhen (CN)

(72) Inventors: Peng Dong, Shenzhen (CN); Jun Tao, Shenzhen (CN)

(73) Assignee: XI'AN ZHONGXING NEW SOFTWARE CO., LTD, Shaanxi (CN)

( * ) Notice: Subject to any disclaimer, the term of this patent is extended or adjusted under 35 U.S.C. 154(b) by 23 days.

(21) Appl. No.: 15/515,205

(22) PCT Filed: Apr. 9, 2015

(86) PCT No.: PCT/CN2015/076190
§ 371 (c)(1),
(2) Date: Mar. 29, 2017

(87) PCT Pub. No.: WO2016/050046
PCT Pub. Date: Apr. 7, 2016

(65) Prior Publication Data
US 2017/0222750 A1    Aug. 3, 2017

(30) Foreign Application Priority Data
Sep. 29, 2014   (CN) .......................... 2014 1 0515112

(51) Int. Cl.
*H04L 1/00* (2006.01)
*H04L 25/49* (2006.01)
(Continued)

(52) U.S. Cl.
CPC ......... *H04L 1/0014* (2013.01); *H03F 1/0294* (2013.01); *H03K 7/08* (2013.01);
(Continued)

(58) Field of Classification Search
CPC ... H04L 1/0014; H04L 1/0016; H04L 1/0017; H04L 1/0042; H04L 1/0043; H04L 25/4921; H03K 7/08; H03F 1/0294
See application file for complete search history.

(56) References Cited

U.S. PATENT DOCUMENTS 7,289,005 B2   10/2007   Puma
8,457,243 B2    6/2013   Vromans
(Continued)

FOREIGN PATENT DOCUMENTS

CN    1791087       6/2006
CN    101884167    11/2010
(Continued)

OTHER PUBLICATIONS

International Search Report for PCT/CN2015/076190, English Translation attached to original, Both completed by the Chinese Patent Office dated May 11, 2015 All together 5 Pages.

*Primary Examiner* — Jaison Joseph
(74) *Attorney, Agent, or Firm* — Plumsea Law Group, LLC

(57) ABSTRACT

An encoding modulation method and transmitter are described. The method includes: oversampling and noise-shaping received multi-bit data to obtain N bits of data; using the N bits of data as a lookup table address to obtain a PWM puke modulation signal; multiplexing synthetic orthogonal (IQ) complex data of the PWM pulse modulation signal to be real number signal data; and converting the multiplexed real number signal data to an analog signal for power amplification and output, N being an integer representing a smaller number of bits than the received multi-bit data.

19 Claims, 4 Drawing Sheets

(51) Int. Cl.
*H03K 7/08* (2006.01)
*H03F 1/02* (2006.01)

(52) U.S. Cl.
CPC .......... *H04L 1/0016* (2013.01); *H04L 1/0017* (2013.01); *H04L 1/0042* (2013.01); *H04L 1/0043* (2013.01); *H04L 25/4921* (2013.01); *H03C 2200/0045* (2013.01); *H03C 2200/0079* (2013.01)

(56) References Cited

U.S. PATENT DOCUMENTS

| | | | |
|---|---|---|---|
| 8,831,085 B2 | 9/2014 | Hezar et al. | |
| 9,294,079 B1* | 3/2016 | Ma | .......................... H03K 7/08 |
| 2013/0156089 A1* | 6/2013 | Hezar | .................. H04L 1/0071 |
| | | | 375/238 |
| 2013/0241663 A1* | 9/2013 | Ding | ........................ H03K 7/08 |
| | | | 332/109 |
| 2016/0309274 A1 | 10/2016 | Ma et al. | |

FOREIGN PATENT DOCUMENTS

| | | |
|---|---|---|
| CN | 103166652 | 6/2013 |
| CN | 103701465 | 4/2014 |
| JP | 2013255003 | 12/2013 |

\* cited by examiner

ENCODING MODULATION METHOD AND TRANSMITTER

CROSS-REFERENCE TO RELATED APPLICATION

This application is the U.S. national phase of PCT Application No. PCT/CN2015/076190 filed Apr. 9, 2015, which claims priority to Chinese Application No. 201410515112.0 filed Sep. 29, 2014, the disclosures of which are incorporated in their entirety by reference herein.

TECHNICAL FIELD

The present disclosure relates to a signal processing technology, in particular to an encoding modulation method and transmitter.

BACKGROUND

As Long Term Evolution Advanced, LTE-A, (Long Term Evolution advanced release) starts for commercial use, the next generation standard, 5G standard, is waiting to be issued, and various equipment manufacturers and operators are also escalating demands for mobile radio frequency, RF, system. The total amount of frequency bands of current global 2G, 3G and 4G LTE reached more than 40, and to obtain frequency band resource, it is needed to support the Carrier Aggregation, CA, and multiple antennas (multiple input multiple output, MIMO) technology and etc., and is needed for the wireless base station to have wide bandwidth, high efficiency, flexible and configurable features and etc., greatly increasing the complexity of RF front end. The full digital transmitter based on the highly efficient switch mode power amplifiers, SMPA, is the ideal solution.

Modern communication system uses a non-constant envelope modulation mode, and traditional transmitter scheme uses a power regression method to meet the requirements of its linearity, which results in the decrease of the efficiency seriously. FIG. 1 is an implement schematic diagram of all-digital transmitter of SMPA in existing art. As shown in FIG. 1, all-digital transmitter of highly efficient SMPA mainly includes: Digital Encode Modulator and SMPA. Digital Encode Modulator completes digital modulation in the digital domain, produces a modulation switch signal to drive the SMPA. Power Amplifier, PA, mainly operates in the saturation region, which has highly efficient, flexible and reconfigurable, high linear characteristics and etc.

At present, all-digital transmitter encode modulator mainly has two kinds, Delta-Sigma Modulator, DSM, and Pulse-Width Modulator, PWM.

DSM and PWM are widely used in the audio field, but it has the following problems. The main problem faced by the DSM is as follows. In the process of DSM processing, the sampling frequency demand is too high and the encoding efficiency is too low. Since the DSM uses the oversampling technology, the higher the oversampling rate is, and the smaller the out-of-band noise of the output signal is, and the better the performance of the SNR, Signal-to-Noise Ratio is. Therefore, for high bandwidth communication signals, it is required for the DSM to operate at a higher sampling frequency, and as a result, it is difficult to realize. In addition, when signal bandwidth is relatively wide, in the composition of the DSM output signal, the proportion of the useful signal energy in the whole signal energy (hereinafter referred to as the encoding efficiency) is very low, and therefore, the final system efficiency (the system efficiency is equal to the product of the signal encoding efficiency and the power amplifier efficiency) is influenced. The main problem faced by the PWM is the issue of accuracy of the digital implementation. When the applications are implemented in the field of digital communication, the signals produced by directly according to the principle and method of the analog circuit has discrete features when the signals pass a digital circuit for the clock driven, so it will produce the error and reduce the performance of signals.

In conclusion, in the field of communication, when encoding modulation is performed by using DSM or PWM, there is the problem on the performance requirements such as oversampling rate and accuracy and the like.

SUMMARY

The embodiments of the present disclosure are to provide an encoding modulation method and transmitter, which can solve the signal error produced by the oversampling rate and PWM, and enhance the performance of the encoding modulation.

An encoding modulation method includes the following steps.

It is to perform a process of oversampling and noise-shaping on received multi-bit data to obtain N-bit data.

It is to look up a table to obtain a pulse modulation signal of a Pulse Width Modulator, PWM, according to the N-bit data used as an address of the lookup table.

It is to multiplex In-phase Quadrature, IQ, complex data of the PWM pulse modulation signal to be a real number signal data to realize up-conversion transformation with a quarter of a sampling rate (sampling rate/4).

It is to convert the multiplexed real number signal data to an analog signal, and perform power amplification on the analog signal to output.

Herein, N is an integer of which a number of bits is smaller than that of the received multi-bit data.

In an exemplary embodiment, the performing a process of noise-shaping on received multi-bit data is: performing the process on the received multi-bit data by using a noise-shaping function of first order, or second order, or higher order.

In an exemplary embodiment, the converting the multiplexed real number signal data to an analog signal and performing power amplification on the analog signal to output include:

driving a switch mode power amplifier, of which a number of channels is determined based on a number of bits of the analog signal, through the converted analog signal for outputting.

In an exemplary embodiment, when the encoding modulation is applied to multi-level scenes, before outputting the signal processed by the switch mode power amplifier, the method further includes: performing a process on information processed by the switch mode power amplifier through a combiner to output.

When the encoding modulation is applied to two-level scenes, before the N-bit data are used as an address of the lookup table, the method further includes: performing a uniform quantization process on the obtained N-bit data.

In an exemplary embodiment, the combiner is a combiner of 6 dB, or a combiner of 3 dB.

When the combiner is a combiner of 6 dB, the method further includes: after obtaining the N-bit data, performing a non-uniform quantization process on the N-bit data.

In an exemplary embodiment, the switch mode power amplifier is a switch mode power amplifier of type D, or type E, or type F.

In an exemplary embodiment, a conversion of the multiplexed real number signal data to the analog signal is realized by using a serial transmitter, Serdes.

A transmitter is provided. The transmitter includes: a Delta Sigma Modulator, DSM, a Pulse Width Modulator, PWM, an up-conversion unit and a converting and power amplification unit.

The DSM is arranged to perform a process of oversampling and noise-shaping on received multi-bit data to obtain N-bit data.

The PWM is arranged to look up a table to obtain a pulse modulation signal of the PWM according to the N-bit data used as an address of the lookup table.

The up-conversion unit is arranged to multiplex In-phase Quadrature, IQ, complex data of the PWM pulse modulation signal to be a stream of real number signal data to realize up-conversion transformation with a quarter of a sampling rate.

The converting and power amplification unit is arranged to convert the multiplexed real number signal data to an analog signal and perform power amplification on the analog signal to output.

Herein, N is an integer of which a number of bits is smaller than that of the received multi-bit data.

In an exemplary embodiment, the DSM is arranged to perform a process of oversampling on the received multi-bit data and perform a process on the received multi-bit data by using a noise-shaping function of first order, or second order, or higher order to obtain the N-bit data.

In an exemplary embodiment, the transmitter further includes a combiner, which is arranged to, when the transmitter is applied to multi-level scenes, before outputting the signal processed by the switch mode power amplifier, perform a process on information processed by the switch mode power amplifier to output.

In an exemplary embodiment, the DSM is further arranged to, when the transmitter is applied to two-level scenes, before the N-bit data are used as an address of the lookup table, perform a uniform quantization process on the obtained N-bit data.

In an exemplary embodiment, the combiner is a combiner of 6 Decibels, dB, or a combiner of 3 dB.

The DSM is further arranged to, when the combiner is the combiner of 6 dB, after obtaining the N-bit data, perform a non-uniform quantization process on the N-bit data.

In an exemplary embodiment, the switch mode power amplifier is a switch mode power amplifier of type D, or type E, or type F.

In an exemplary embodiment, the converting and power amplification unit is arranged to realize a conversion of the multiplexed real number signal data to the analog signal by using a serial transmitter, Serdes.

Compared to the existing art, a technical scheme provided by the embodiments of the present disclosure includes: performing a process of oversampling and noise-shaping on received multi-bit data to obtain N-bit data; looking up a table to obtain a pulse modulation signal of a Pulse Width Modulator, PWM, according to the N-bit data used as an address of the lookup table; multiplexing In-phase Quadrature, IQ, complex data of the PWM pulse modulation signal to be a real number signal data to realize up-conversion transformation with a quarter of a sampling rate (sampling rate/4); converting the multiplexed real number signal data to an analog signal and performing power amplification on the analog signal to output. In the embodiment of the present disclosure, through a combination of DSM and PWM, in the DSM oversampling process, the number of bits of obtained N-bit data is smaller than that of the received multi-bit data, and the bit width is compressed. Therefore, it only needs to use a lookup table with a smaller size to obtain the pulse modulation signal of the PWM, which enhances the accuracy and performance of the operating in the system, and the whole efficiency of the encoding modulation. In addition, by oversampling of DSM, and the working clock rate is obtained which is easy to implement in the operating process of encoding modulation, it reduces the difficulty of implementation for the system encoding modulation. By using switch mode power amplifier, the operating efficiency of the transmitter is improved.

BRIEF DESCRIPTION OF DRAWINGS

Arranged as follows.

FIG. 4 (b) is a schematic diagram of output voltage of an output port of a combiner in the process that the input voltage of the port 2 of the combiner of 6 dB increases from 0 v to 10 v.

FIG. 5 (b) is a schematic diagram of the relationship between the input voltage of the port 2 of a 3 dB combiner and the voltage of the combiner.

DETAILED DESCRIPTION

The preferred embodiments of the present disclosure will be described below in detail in combination with the drawings. It should be illustrated that, in the case of not conflicting, the embodiments in the present application and features in these embodiments can be combined with each other arbitrarily.

Figure 1:
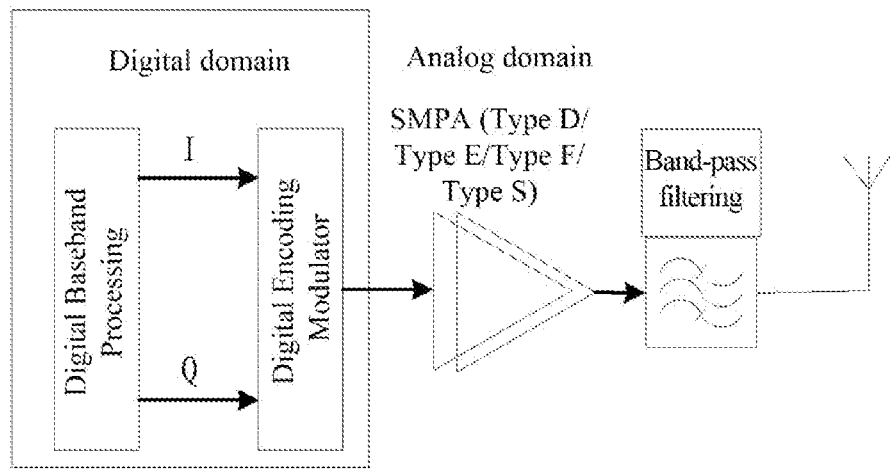
FIG. 1 is an implement schematic diagram of all-digital transmitter of SMPA in existing art.
Figure 2:
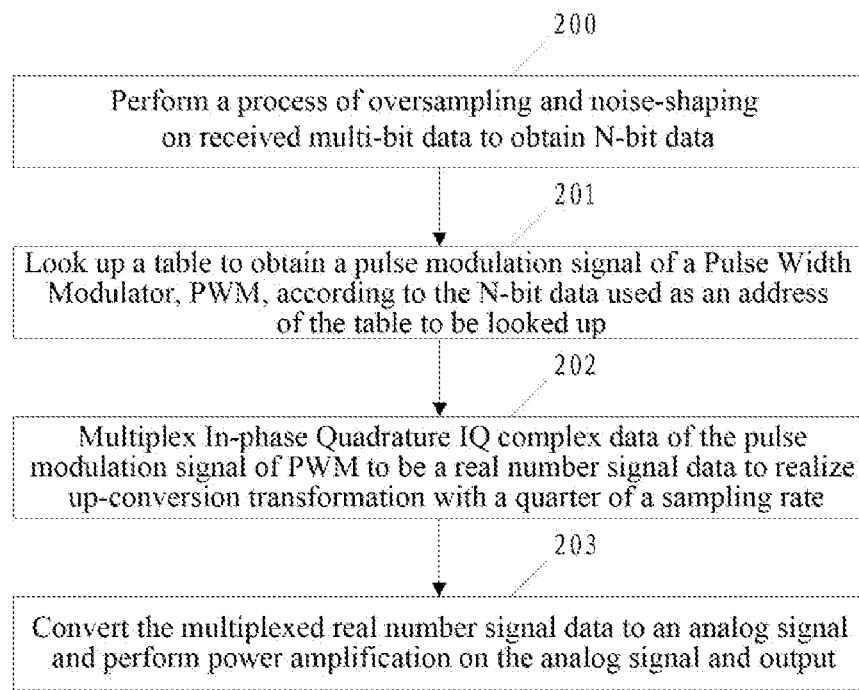
FIG. 2 is a flow chart of a method for implementing the encoding modulation in an embodiment of the present disclosure.

FIG. 2 is a flow chart of a method for implementing the encoding modulation in an embodiment of the present disclosure. As shown in FIG. 2, the method includes the steps 200-203.

In step 200, it is to perform a process of oversampling and noise-shaping on received multi-bit data to obtain N-bit data.

N is an integer of which a number of bits is smaller than that of the received multi-bit data.

In the present step, performing a process of noise-shaping on received multi-bit data includes: performing the process on the received multi-bit data by using a noise-shaping function of first order, or second order, or higher order. Herein, the higher order shaping function is a noise-shaping function of which the order is larger than that of second order.

It should be illustrated that, the number of bits of the N-bit data obtained by the sampling process of multi-bit data is smaller than the number of bits of received multi-bit data. Therefore, the bit width is compressed, pulse modulation signals of PWM can be obtained through a table of a smaller size for lookup (the smaller size of the table is smaller than the size of a table directly processing the received multi-bit data). In step 201, a table is looked up to obtain a pulse modulation signal of a PWM according to the N-bit data used as an address of the lookup table.

In the process of looking up the table, the parallel-serial conversion of N-bit data is realized, single-bit pulse modulation signal of the PWM is output, and the rate of data transmission is improved to $2^N$ times of the original rate.

In step 202, it is to multiplex In-phase Quadrature, IQ, complex data of the pulse modulation signal of the PWM to be a stream of real number signal data to realize up-conversion transformation with a quarter of a sampling rate.

In step 203, it is to convert the multiplexed real number signal data to an analog signal, and perform power amplification on the analog signal and output.

In present step, in an exemplary embodiment, the conversion of the multiplexed real number signal data is realized to the analog signal by using a serial transmitter Serdes. Here, for multi-level scenes, the multi-channel Serdes can be arranged.

In an exemplary embodiment, the converted analog signal is used to drive the switch mode power amplifier for outputing, of which a number of channels is determined based on the number of bits of the analog signal.

The switch mode power amplifier may be a switch mode power amplifier of type D, or type E, or type F.

It should be illustrated that the switch mode power amplifier of type D, or type E, or type F may operate in a saturated state, and under the drive of the constant envelope signals, the efficiency is high and the nonlinear distortion is small. For other switch mode power amplifier which is applicable to the embodiment of the present disclosure, it also may be applied to the embodiment of the present disclosure, such as the switch mode power amplifier of type S. For two-level application scenes, it can use one-channel power amplifier. For multi-level application scenes, the number of channels of the power amplifier is determined according to the number of bits of the analog signal. Here, the real number signal data is digital signal, and it realizes the conversion from the digital signal to the analog signal by Serdes. Compared to the process of encoding modulation in existing art, Digital-to-Analog Convertor, DAC, device is saved, and the operating efficiency of the transmitter is improved by using the switch mode power amplifier.

When the encoding modulation is applied to multi-level scenes, before outputting the signal processed by the switch mode power amplifier, the method of the embodiment of the present disclosure further includes: performing a process on information after the process of the switch mode power amplifier through a combiner and output; and when the encoding modulation is applied to two-level scenes, before the N-bit data are used as an address of the lookup table, the method further comprises: performing a uniform quantization process on the obtained N-bit data.

The combiner is a combiner of 6 Decibels, dB, or a combiner of 3 dB.

When the combiner is a combiner of 6 dB, the method further includes: after obtaining the N-bit data, performing a non-uniform quantization process on the N-bit data.

It should be illustrated that, since the use of the combiner of 6 dB can cause a distortion effect of "compression" for the modulated and encoded signal, it is needed to perform a non-uniform quantization process on obtained N-bit data, such that the quantized range of high level signal thereof is "stretched", and "compression" and "stretching" will be canceled out, and the undistorted signal is restored. In addition, a combiner of 6 dB is only an alternative solution. Other combiner mode of higher coupling coefficient also may be applied to embodiments of the present disclosure. By using the combiner, when the single-channel signal is conducted, the power loss of the coupler is small.

In the embodiment of the present disclosure, through a combination of DSM and PWM, in the DSM oversampling process the number of bits of obtained N-bit data is smaller than that of the received multi-bit data, and the bit width is compressed. Therefore, it only needs to use a lookup table with a smaller size to obtain pulse modulation signals of the PWM, which enhances the accuracy and performance in the operating of the system, and enhances the whole efficiency of the encoding modulation. In addition, by oversampling of DSM, the working clock rate is obtained which is easy to implement in the operating process of encoding modulation, it reduces the difficulty of implementation for the system encoding modulation. And, compared to the traditional transmitter architecture, converting multi-bit input data to multi-channel single-bit data saves the DAC and the analog up-conversion structure, and by using the switch mode power amplifier, the operating efficiency of the transmitter is improved.

Figure 3:
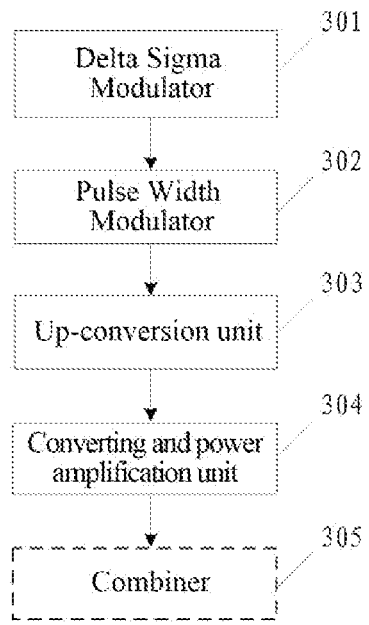
FIG. 3 is a structural block diagram of a transmitter in an embodiment of the present disclosure.

FIG. 3 is a structural block diagram of a transmitter in an embodiment of the present disclosure. As shown in FIG. 3, the transmitter includes: a Delta Sigma Modulator, DSM, 301, a Pulse Width Modulator, PWM, 302, an up-conversion unit 303 and a converting and power amplification unit 304.

The DSM 301 is arranged to perform a process of oversampling and noise-shaping on received multi-bit data to obtain N-bit data. N is an integer of which a number of bits is smaller than that of the received multi-bit data.

The DSM 301 is arranged to perform a process of oversampling on the received multi-bit data and perform a process on the received multi-bit data by using a noise-shaping function of first order, or second order, or higher order, to obtain the N-bit data.

The PWM 302 is arranged to look up a table to obtain a PWM pulse modulation signal according to the N-bit data used as an address of the lookup table.

The up-conversion unit 303 is arranged to multiplex In-phase Quadrature, IQ, complex data of the pulse modulation signal of the PWM to be a stream of real number signal data to realize up-conversion transformation of a quarter of a sampling rate.

The converting and power amplification unit 304 is arranged to convert the multiplexed real number signal data to an analog signal, and perform power amplification on the analog signal to output.

In an exemplary embodiment, the converting and power amplification unit 304 is arranged to drive the switch mode power amplifier, of which the number of channels is determined based on the number of bits of analog signal, through the converted analog signal for outputing. In an exemplary embodiment, the switch mode power amplifier is a switch mode power amplifier of type D, or type E, or type F. The conversion of the multiplexed real number signal data to the analog signal is realized by using a serial transmitter, Serdes.

The transmitter further includes a combiner 305, which is arranged to, when the transmitter is applied to multi-level scenes, before outputting the signal processed by the switch mode power amplifier, perform a process on information processed by the switch mode power amplifier to output.

The DSM 301 is further arranged to, when the transmitter is applied to two-level scenes, before the N-bit data are used as an address of the lookup table, perform a uniform quantization process on the obtained N-bit data.

In an exemplary embodiment, the combiner is a combiner of 6 dB, or a combiner of 3 dB.

The DSM 301 is further arranged to, when the combiner is the combiner of 6 dB, after obtaining the N-bit data, perform a non-uniform quantization process on the N-bit data.

The embodiments of the present disclosure will be described below in detail.

Embodiment One

The embodiment takes the multi-level scenes as an example, describes the process of the encoding modulation for the embodiments of the present disclosure.

The transmitter includes: a DSM, a PWM, an up-conversion unit and a converting and power amplification unit and a combiner.

To determine whether a non-uniform quantization is performed in DSM stage, the embodiment supposes that the combiner of 6 dB is applicative, that is a non-uniform quantization needs to be performed in the DSM stage.

The DSM performs a process of oversampling and noise-shaping for the received multi-bit data to obtain the N-bit data. Herein, the noise-shaping process is realized by using a noise-shaping function of first order, or second order, or higher order.

Since the combiner of 6 dB is used, to avoid the distortion caused by the amplitude compression features of the combiner, non-uniform quantization is performed. Here, if the applicable combiner is the combiner of 3 dB, it does not need to perform a non-uniform quantization. If it is used in the two level scenes, then there is no need for a combiner, and a uniform quantization may be performed.

When using a non-uniform quantization, since the combiner of 6 dB is used, and the high level quantization interval is small, and the low level quantized interval is big, the quantization step size of high level part of the non-uniform quantization is set to 1.375, and the quantization step size of low level is set to 0.625, such that the quantized range of the low level (level numerical value assumed to [−8,0]) is [−8,3], and the quantized range of the high level (level numerical value assumed to [0,8]) is [3,8]. Therefore, the quantized range of low level is greater than the quantized range of the high level. Table 1 is the comparison between non-uniform quantization and uniform quantization, as shown in table 1.

TABLE 1

| Level value | Uniform quantization | Non-uniform quantization | Quantization numerical value output to PWM |
|---|---|---|---|
| 16 | 8 | 8 | 8 |
| 15 | 7 | 7.375 | 7 |
| 14 | 6 | 6.75 | 6 |
| 13 | 5 | 6.125 | 5 |
| 12 | 4 | 5.5 | 4 |
| 11 | 3 | 4.875 | 3 |
| 10 | 2 | 4.25 | 2 |
| 9 | 1 | 3.625 | 1 |
| 8 | 0 | 3 | 0 |
| 7 | −1 | 1.625 | −1 |
| 6 | −2 | 0.25 | −2 |
| 5 | −3 | −1.125 | −3 |
| 4 | −4 | −2.5 | −4 |
| 3 | −5 | −3.875 | −5 |
| 2 | −6 | −5.25 | −6 |

TABLE 1-continued

| Level value | Uniform quantization | Non-uniform quantization | Quantization numerical value output to PWM |
|---|---|---|---|
| 1 | −7 | −6.625 | −7 |
| 0 | −8 | −8 | −8 |

Taking N=4 for an example, the bit width of multi-bit data is 16 bits, and the sampling rate of the oversampling is Fs=122.88 Msps. After the DSM processing, the bit width is compressed to 4 bits; the sampling rate of the oversampling is constant; then after the PWM processing, single-bit data are output. Therefore, the sampling rate increases to Fs*$2^N$=1966.1 Msps. Through the above processing, the DSM runs in an ordinary work clock rate, which is very easy to implement. At the same time, the performance of the output signal of the multi-bit DSM also can meet the target requirements. While the PWM module is realized by a very small lookup table, and the precision thereof is very high, and the performance of the generated signal is also very good.

PWM looks up a table to obtain a pulse modulation signal of a PWM according to the N-bit data used as an address of a lookup table. Each address of the lookup table corresponds to a data whose bit width is $2^N$, and then the $2^N$ bits data is output bit by bit in serial. In the process of the parallel-serial conversion, the sampling rate is increased to $2^N$ times of the original rate. By replacing the content of the lookup table, the multi-level output signal is output. In two-level scenes, two-level output signal is output.

PWM output signal passes through the up-conversion unit, and the sampling rate is promoted to the Fs=3932.16 Msps (122.88 Msps*2*$2^N$, the final*2 represents for two channels of IQ), and the carrier frequency is Fc=Fs/4=938.04 MHz.

Conversion of digital to analog may be performed on multi-channel single-bit signals in the digital domain may be performed through multi-channel Serdes. The analog signal on which the conversion is completed is sent to a switch mode power amplifier to realize the power amplification.

Finally, the combiner of 6 dB combines two-channel signals to three-level signals to output. Here, the combiner is a passive combiner.

To clearly describe the encoding modulation processing in embodiments of the present disclosure, in combination with parts of figures to additionally explain the processing process, in the following drawing illustration, the port 1 is the port with relatively high power in the input of the combiner; and the port 2 is the port with relatively low power. Take the port 1 with constant input voltage 10 v as an example.

Figure 4A:
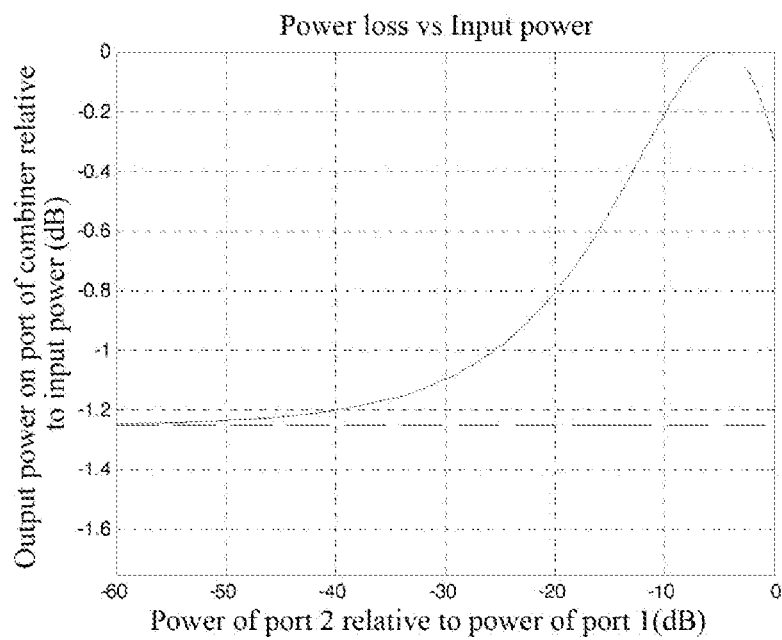
FIG. 4 (a) is a schematic diagram of a relationship between input power of the port 2 of a 6 dB combiner and power loss of the combiner.
Figure 4B:
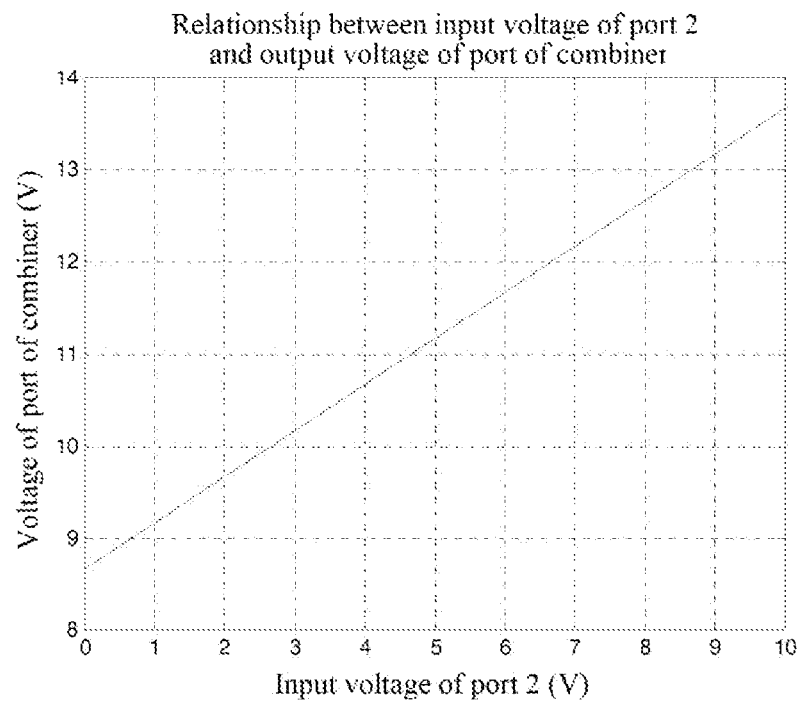

FIG. 4 (*a*) is a schematic diagram of the relationship between input power of the port 2 of a combiner of 6 dB and power loss of the combiner. As shown in FIG. 4 (*a*), when the input power of the port 2 is equal to that of the port 1, the power loss of the combiner is 0.3 dB at this time. With the power of the port 2 declines relative to the power of the port 1, the power loss of the combiner gradually increased to 1.2 dB. That is, the power loss of the combiner of 6 dB in single-channel input is smaller than that of the combiner of 3 dB. However, for the actual output signal, statistical probability of single-channel output is larger than that of dual-channel output. Therefore, statistically, the overall power loss of the combiner of 6 dB is smaller than that of the combiner of 3 dB.

FIG. 4 (b) is a schematic diagram of output voltage of the output port of a combiner in the process that the input voltage of the port 2 of the combiner of 6 dB increases from 0 v to 10 v. As shown in FIG. 4 (b), under the condition of input 10V voltage at port 1, and when input voltage at port 2 is 0, the voltage amplitude of output of the combiner is 8.66V; and when the input of port 2 is 10V, the voltage amplitude of output of the combiner is 13.66V. This means that in multi-level applications (takes three-level as an example), when there is only one channel of input loaded at port 1 of the combiner (for example, when only the low level branch has the signal), the output voltage of the combiner changes between [0, 8.66]; when there are two channels of input loaded at port 1 and port 2 of the combiner (for example, when the high level branch and the low level branch both have the signals), the output voltage of the combiner changes between [8.66, 13.66]. The change amplitudes of high level and low level are not same. Herein, the change amplitude of low level is 8.66V, and the change amplitude of high level is 5V. Under the excitation of increment with same input amplitude at two ports, the output increments at the output port of the combiner are not same, and the output increment under the excitation of the port 2 produces the effect of amplitude compression, and it is a non-linear changing process. Here, the nonlinear effects produced by the combiner need to be offset by the non-uniform quantization process of the former-level DSM module.

In addition, when the combiner of 3 dB is used, it is assumed that there is constant input power at port 1.

Figure 5A:
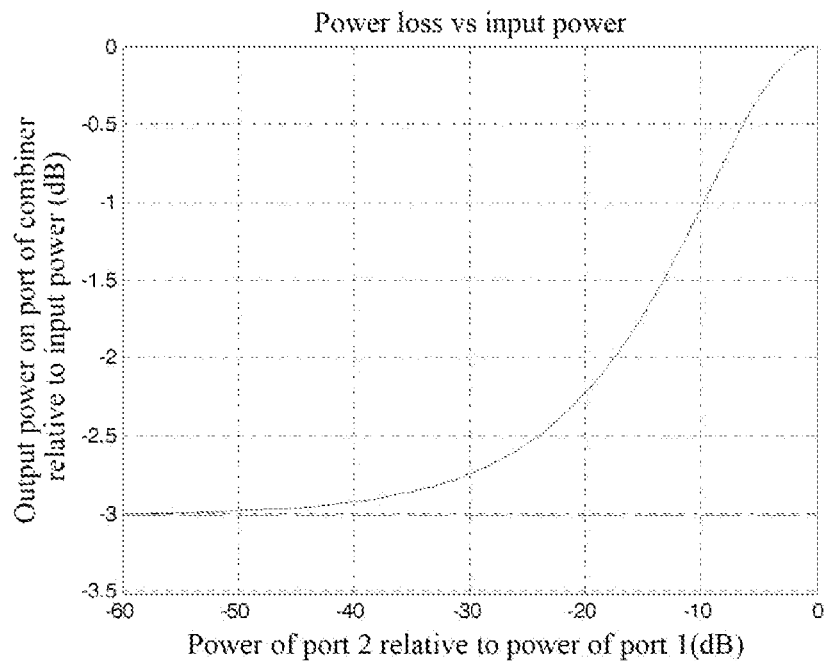
FIG. 5 (a) is a schematic diagram of the relationship between the input power of the port 2 of a combiner of 3 dB and power loss of the combiner.
Figure 5B:
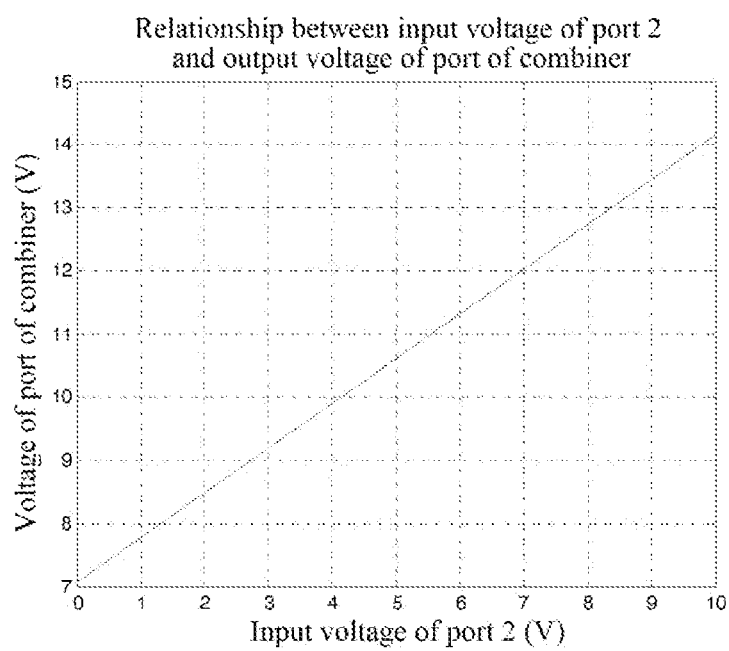

FIG. 5 (a) is a schematic diagram of the relationship between the input power of the port 2 of a combiner of 3 dB and power loss of the combiner. As shown in FIG. 5 (a), when there is constant input power at port 1, and when the input power of the port 2 is equal to that of port 1, i.e., 0 dB, the combiner has no power loss at this time; and with the power of the port 2 declines relative to the power of the port 1, the power loss of the combiner gradually increases to 3 dB.

FIG. 5 (b) is a schematic diagram of the relationship between the input voltage of the port 2 of a combiner of 3 dB and the voltage of the combiner. As shown in FIG. 5 (b), when a constant voltage is input at port 1 (for example, 10V) and there is no input voltage at the port 2, the voltage amplitude of output of the combiner is $10/\sqrt{2}=7.07V$; and when the input voltage of port 2 is same with the input voltage of port 1 (10V), the voltage amplitude of output of the combiner is $10\sqrt{2}=14.14V$. This means that in multi-level applications (takes three-level as an example), when there is only one channel of input loaded at port 1 of the combiner (for example, when only the low level branch has the signal), the output voltage of the combiner changes between [0, 7.07]; when there are two channels of input loaded at port 1 and port 2 of the combiner (for example, when the high level branch and the low level branch both have the signals), the output voltage of the combiner changes between [7.07, 14.14]. The change amplitudes of high level and low level are the same, i.e., both are 7.07V, and under the excitation of increment with same input amplitude at two ports, the output increments at the output port of the combiners are the same, and it is a linear changing process.

The ordinary person skilled in the art can understand that all or part of steps of the above embodiments can be implemented by using a flow of computer program, and the computer program can be stored in a computer readable memory medium. The computer program is executed on corresponding hardware platforms (such as a system, a device, an apparatus and a component, etc.), and when the computer program is carried out, one of the steps or a combination of the steps of the method embodiments is included.

In an exemplary embodiment, all or part of the steps of the above embodiments can also be implemented by using integrated circuits, these steps can be made into various integrated circuit modules respectively, or a plurality of modules or steps can be made into a single integrated circuit module to be implemented. Therefore, the present disclosure is not limited to any combination of hardware and software in a specific form.

Various apparatuses/functional modules/functional units in the above embodiments can be implemented by using a universal calculating device, and they can be concentrated on a single calculating device or distributed in a network consisting of a plurality of calculating devices.

If implemented in the form of a software function module and sold or used as an independent product, various apparatuses/functional modules/functional units in the above embodiments can be stored in a computer readable memory medium. The above-mentioned computer readable memory medium may be a read-only memory, a magnetic disk or an optical disk, etc.

INDUSTRIAL APPLICABILITY

In the embodiments of the present disclosure, through a combination of DSM and PWM, in the DSM oversampling process, the number of bits of the obtained N-bit data is smaller than that of received multi-bit data, and the bit width is compressed. Therefore, it only needs to use a lookup table with a smaller size to obtain a pulse modulation signal of the PWM, enhancing the accuracy and performance in the operating of the system, and enhancing the whole efficiency of the encoding modulation. In addition, by oversampling of DSM, the working clock rate is obtained which is easy to implement in the operating process of encoding modulation, the difficulty of implementation for the system encoding modulation is reduced.

What we claim is:
1. An encoding modulation method, comprising:
performing a process of oversampling and noise-shaping for received multi-bit data to obtain N-bit data;
looking up a table to obtain a pulse modulation signal of a Pulse Width Modulator, PWM, according to the N-bit data used as an address of the lookup table;
multiplexing In-phase Quadrature, IQ, complex data of the pulse modulation signal of the PWM to be a stream of real number signal data to realize up-conversion transformation with a quarter of a sampling rate;
converting the multiplexed real number signal data to an analog signal and performing power amplification on the analog signal to output, and
wherein, N is an integer of which a number of bits is smaller than that of the received multi-bit data.
2. The method according to claim 1, wherein,
the performing a process of noise-shaping on received multi-bit data is: performing the process on the received multi-bit data by using a noise-shaping function of first order, or second order, or higher order.
3. The method according to claim 1, wherein:
said converting the multiplexed real number signal data to an analog signal and performing power amplification on the analog signal to output comprises:

driving a switch mode power amplifier, of which a number of channels is determined based on a number of bits of the analog signal, through the converted analog signal for outputting.

4. The method according to claim 3, when the encoding modulation is applied to multi-level scenes, before outputting the signal processed by the switch mode power amplifier, the method further comprises:
performing a process on information processed by the switch mode power amplifier through a combiner to output;
when the encoding modulation is applied to two-level scenes, before the N-bit data are used as an address of the lookup table, the method further comprises: performing a uniform quantization process on the obtained N-bit data.

5. The method according to claim 4, wherein:
The combiner is a combiner of 6 Decibels, dB, or a combiner of 3 dB; and
when the combiner is a combiner of 6 dB, the method further comprises: after obtaining the N-bit data, performing a non-uniform quantization process on the N-bit data.

6. The method according to claim 3, wherein:
The switch mode power amplifier is a switch mode power amplifier of type D, or type E, or type F.

7. The method according to claim 3, wherein,
realizing a conversion of the multiplexed real number signal data to the analog signal by using a serial transmitter.

8. A transmitter, comprising: a Delta Sigma Modulator, DSM, a Pulse Width Modulator, PWM, an up-conversion unit and a converting and power amplification unit; wherein,
the DSM is arranged to perform a process of oversampling and noise-shaping on received multi-bit data to obtain N-bit data;
the PWM is arranged to look up a table to obtain a pulse modulation signal of the PWM according to the N-bit data used as an address of the lookup table;
the up-conversion unit is arranged to multiplex In-phase Quadrature, IQ, complex data of the pulse modulation signal of the PWM to be a stream of real number signal data to realize up-conversion transformation with a quarter of a sampling rate;
the converting and power amplification unit is arranged to convert the multiplexed real number signal data to an analog signal and perform power amplification on the analog signal to output; and
wherein, N is an integer of which a number of bits is smaller than that of the received multi-bit data.

9. The transmitter according to claim 8, wherein,
the DSM is arranged to perform a process of oversampling on the received multi-bit data and perform a process on the received multi-bit data by using a noise-shaping function of first order, or second order, or higher order to obtain the N-bit data.

10. The transmitter according to claim 8, wherein,
The converting and power amplification unit is arranged to drive a switch mode power amplifier, of which a number of channels is determined based on a number of bits of the analog signal, through the converted analog signal for outputting.

11. The transmitter according to claim 10, wherein,
the transmitter further comprises a combiner arranged to, when the transmitter is applied to multi-level scenes, before outputting the signal processed by the switch mode power amplifier, perform a process on information processed by the switch mode power amplifier to output.

12. The transmitter according to claim 8, wherein,
The DSM is further arranged to, when the transmitter is applied to two-level scenes, before the N-bit data are used as an address of the lookup table, perform a uniform quantization process or a non-uniform quantization process on the obtained N-bit data.

13. The transmitter according to claim 11, wherein,
the combiner is a combiner of 6 Decibels, dB, or a combiner of 3 dB;
the DSM is further arranged to, when the combiner is the combiner of 6 dB, after obtaining the N-bit data, perform a non-uniform quantization process on the N-bit data.

14. The transmitter according to claim 10, wherein,
the switch mode power amplifier is a switch mode power amplifier of type D, or type E, or type F.

15. The transmitter according to claim 8, wherein,
The converting and power amplification unit is arranged to realize a conversion of the multiplexed real number signal data to the analog signal by using a serial transmitter.

16. The method according to claim 4, wherein:
The switch mode power amplifier is a switch mode power amplifier of type D, or type E, or type F.

17. The method according to claim 4, wherein,
realizing a conversion of the multiplexed real number signal data to the analog signal by using a serial transmitter.

18. The transmitter according to claim 11, wherein,
the switch mode power amplifier is a switch mode power amplifier of type D, or type E, or type F.

19. The transmitter according to claim 11, wherein,
The converting and power amplification unit is arranged to realize a conversion of the multiplexed real number signal data to the analog signal by using a serial transmitter.

* * * * *